United States Patent
Bickford et al.

(10) Patent No.: US 9,514,999 B2
(45) Date of Patent: Dec. 6, 2016

(54) SYSTEMS AND METHODS FOR SEMICONDUCTOR LINE SCRIBE LINE CENTERING

(71) Applicant: INTERNATIONAL BUSINESS MACHINES CORPORATION, Armonk, NY (US)

(72) Inventors: Jeanne P. Bickford, Essex Junction, VT (US); Kevin K. Dezfulian, Mount Kisco, NY (US); Aurelius L. Graninger, Essex Junction, VT (US); Erik L. Hedberg, Essex Junction, VT (US); Troy J. Perry, Georgia, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 517 days.

(21) Appl. No.: 13/732,708

(22) Filed: Jan. 2, 2013

(65) Prior Publication Data
US 2014/0188265 A1     Jul. 3, 2014

(51) Int. Cl.
*H01L 21/66* (2006.01)

(52) U.S. Cl.
CPC ............... *H01L 22/12* (2013.01); *H01L 22/14* (2013.01); *H01L 22/20* (2013.01); *H01L 22/34* (2013.01); *H01L 2924/0002* (2013.01)

(58) Field of Classification Search
CPC .......... H01L 22/20; H01L 22/12; H01L 21/02; H01L 21/67259; H01L 21/02002; H01L 21/00; H01L 22/14; H01L 22/34; H01L 2924/0002

USPC .......................................................... 700/121
See application file for complete search history.

(56) References Cited

U.S. PATENT DOCUMENTS

| | | | |
|---|---|---|---|
| 5,383,132 A | * | 1/1995 | Shinohara ........... G06F 17/5081 716/112 |
| 6,365,422 B1 | | 4/2002 | Hewett et al. |

(Continued)

OTHER PUBLICATIONS

IBM, Method to qualify primary and follow on semiconductor manufacturing sources using an on-chip parametric monitor like the Scalable Parametric Measurement Macro. Jun. 12, 2007, IP, IP No. 000153869, pp. 1-3.*

(Continued)

*Primary Examiner* — Robert Fennema
*Assistant Examiner* — Jennifer L Norton
(74) *Attorney, Agent, or Firm* — David Cain; Andrew M. Calderon; Roberts Mlotkowski Safran, Cole & Calderon, P.C.

(57) ABSTRACT

Methods and systems for semiconductor line scribe centering are provided. A method includes placing and measuring substantially identical test macros within a chip and in a scribe line. The method also includes establishing an estimate correlation between scribe line measurements taken during a manufacturing process and product measurements taken on a final product. The method also includes determining empirical scribe line specification limits consistent with established product screen limits. The method also includes adjusting the manufacturing process in order to optimize performance to the empirical scribe line specification limits.

20 Claims, 4 Drawing Sheets

(56) References Cited

U.S. PATENT DOCUMENTS

| | | | | |
|---|---|---|---|---|
| 6,379,848 | B1* | 4/2002 | McMullen | G01N 21/8803 348/87 |
| 6,720,194 | B1* | 4/2004 | Miller | H01L 22/20 257/E21.525 |
| 6,986,280 | B2 | 1/2006 | Muckenhirm | |
| 7,385,864 | B2 | 6/2008 | Loh et al. | |
| 7,650,946 | B2 | 1/2010 | Gazewood | |
| 7,653,888 | B2 | 1/2010 | Habib et al. | |
| 7,736,916 | B2 | 6/2010 | Aghababazadeh et al. | |
| 7,962,234 | B2 | 6/2011 | Song et al. | |
| 7,966,087 | B2 | 6/2011 | Kokotov et al. | |
| 2004/0169861 | A1* | 9/2004 | Mieher | G01N 21/956 356/400 |
| 2005/0195398 | A1* | 9/2005 | Adel | B82Y 10/00 356/401 |
| 2008/0018356 | A1* | 1/2008 | Anand | G01R 31/31723 324/762.02 |
| 2008/0231307 | A1* | 9/2008 | Bickford et al. | 324/765 |
| 2009/0039912 | A1* | 2/2009 | Bickford et al. | 324/765 |
| 2009/0070722 | A1* | 3/2009 | Bickford et al. | 716/10 |
| 2009/0210201 | A1* | 8/2009 | Bickford et al. | 703/2 |
| 2010/0253382 | A1* | 10/2010 | Wang | G01R 31/2884 324/762.09 |
| 2013/0120739 | A1* | 5/2013 | Dai | G03F 7/70633 356/72 |

OTHER PUBLICATIONS

D. Boolchandani, Lokesh Garg, Sapna Khandelwal and Vineet Sahula, Variability Aware Yield Optimal Sizing of Analog Circuits using SVM-Genetic Approach, IEEE, Symbolic and Numerical Methods, Modeling and Applications to Circuit Design (SM2ACD), 2010 XIth International Workshop.*

Gattiker et al., "Data Analysis Techniques for CMOS Technology Characterization and Product Impact Assessment," IEEE International Test Conference, 2006, ITC '06, Oct. 2006, 10 pages.

Steinbrueck et al., "Non-Contact, Pad-less Measurement Technology and Test Structures for Characterization of Cross-Wafer and In-Die Product Variability," IEEE International Conference on Microelectronic Test Structures, 2009. ICMTS 2009, pp. 91-95.

Bickford et al., "Use of Scalable Parametric Measurement Macro to Improve Semiconductor Technology Characterization and Product Test," 2010 11th International Symposium on Quality Electronic Design (ISQED), Mar. 22-24, 2010, pp. 315-319.

Office Action Dated Nov. 27, 2015 in related U.S. Appl. No. 13/732,932, 23 Pages.

Final Office Action dated Jul. 6, 2016 in related U.S. Appl. No. 13/732,932, 32 pages.

Notice of Allowance in related U.S. Appl. No. 13/732,932 dated Sep. 23, 2016, 22 pages.

* cited by examiner

SYSTEMS AND METHODS FOR SEMICONDUCTOR LINE SCRIBE LINE CENTERING

FIELD OF THE INVENTION

The invention relates to semiconductor devices and, more particularly, to systems and methods for semiconductor line centering.

BACKGROUND OF THE INVENTION

Process variation is an increasingly important factor in the design of integrated circuits (ICs) fabricated in advanced semiconductor technologies. Because the precise knowledge of variation is becoming an even more integral part of the design process as technology continues to scale, testing techniques are needed to extract, measure, and characterize variation in a given process and link it to circuit performance.

Process variation in IC fabrication is the deviation from intended or designed values for a structure or circuit parameter of concern. Process variation can result in the fluctuation of parameter values and dimensions in both the structural device and interconnect levels, which can influence the performance of ICs.

In a typical IC manufacturing process, test macros are included in the scribe lines between product chips. Test structures within these scribe line macros may be monitored by physical measurement or electrical test. The data collected may be compared against established limits as part of a process control system. In addition, it is common that certain parametric test macros embedded within product chips are tested during final product test. These product macros may be used to screen parts against established limits. Because one set of data are used for process control while another set are used to screen finished products; differences between the two can lead to false rejects and unanticipated yield loss. Differences in macros design, test conditions, or process, can introduce offsets and reduce the correlation between scribe line data and product data. In advanced semiconductor technologies, characterizing the offsets between these data is a substantial manufacturing challenge.

Accordingly, there exists a need in the art to overcome the deficiencies and limitations described hereinabove.

SUMMARY

In a first aspect of the invention, a method comprises placing and measuring substantially identical test macros within a chip and in a scribe line. The method also comprises establishing an estimate correlation between scribe line measurements taken during a manufacturing process and product measurements taken on a final product. The method further comprises determining empirical scribe line specification limits consistent with established product screen limits. The method further comprises adjusting the manufacturing process in order to optimize performance to the empirical scribe line specification limits.

In another aspect of the invention, a method comprises: creating specification limits for a product and scribe line measurements; embedding monitor devices in testable on-product structures and testable scribe-line structures; measuring scribe-line monitors and dispositions to scribe-line limits at manufacturing line test point(s); adjusting a manufacturing process to maximize product yield by centering the manufacturing process within scribe line specification limits; measuring product monitors and dispositions to determine product limits at product test point(s); and determining that an estimate correlation line intersects opposing specification limit corners. When the estimate correlation line does not intersect the opposing specification limit corners, the method adjusts the scribe line control limits, such that the estimate correlation line is centered between the opposing specification limit corners. When the estimate correlation line intersects the opposing specification limit corners, the scribe line measurement limits are deemed accurate.

In yet another aspect of the invention, a computer system for process control in a semiconductor manufacturing line comprises a central processing unit (CPU), a computer readable memory and a tangible computer readable storage media. The computer system comprises first program instructions to measure test macros placed within a chip and in a scribe line. The computer system also includes second program instructions to determine an estimate correlation function between measurements taken in the scribe line and measurements taken in a final product. The computer system further includes third program instructions to compute empirical scribe line specification limits consistent with input product screen limits. The computer system further includes a forth program to adjust a manufacturing process in order to optimize performance to the empirical scribe line specification limits. The first, second, third and fourth program instructions are stored on the computer readable storage media for execution by the CPU via the computer readable memory.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

Figure 1:
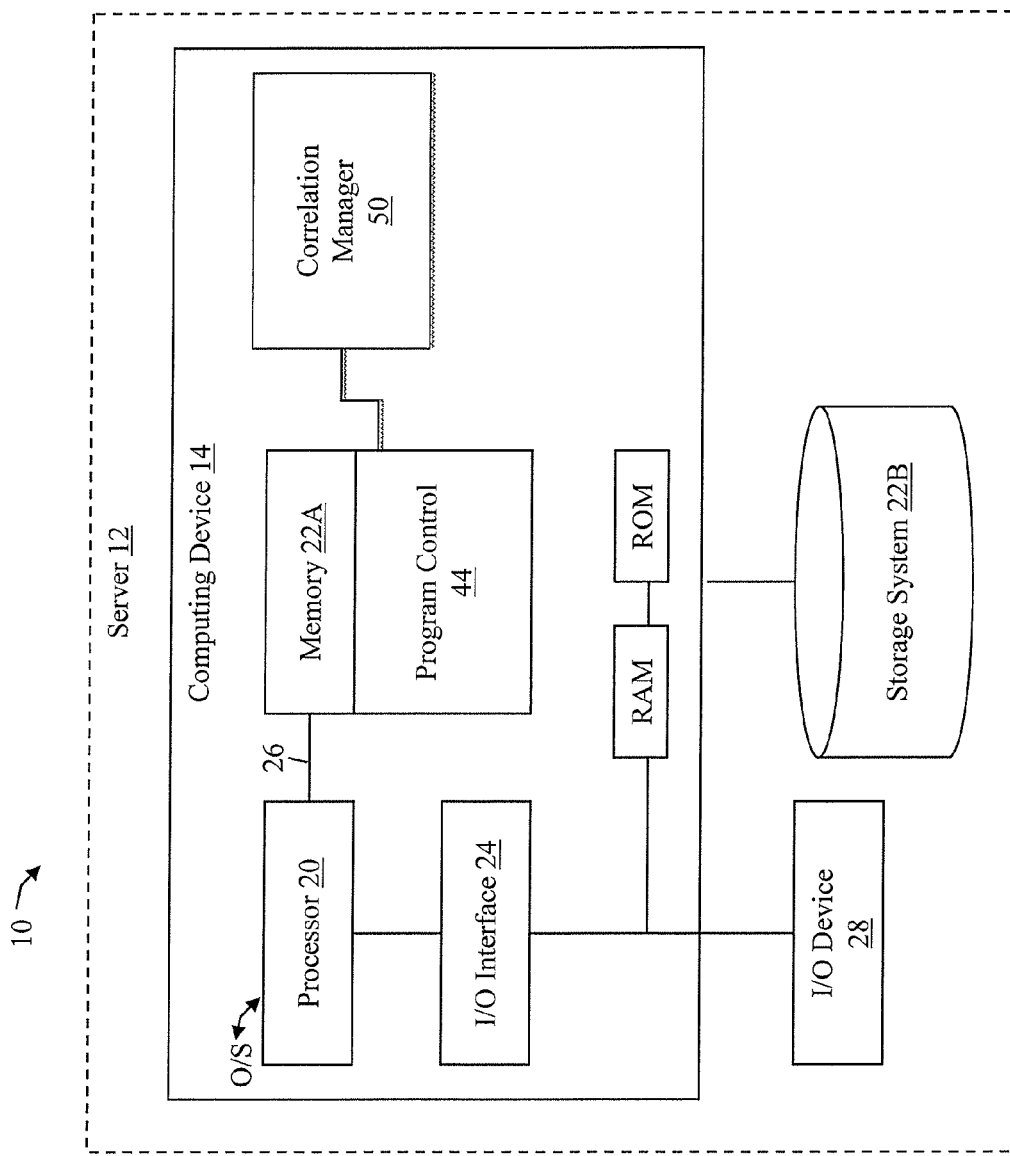
FIG. 1 shows an illustrative environment for implementing steps in accordance with aspects of the present invention.

The invention relates to semiconductor devices and, more particularly, to systems and methods for semiconductor line centering. The present invention can be used to advantageously place substantially identical product disposition macros within product chips and along scribe lines. In this way, the present invention can be used for in-line test and control of the manufacturing process as well as end-of-line test and screen of finished products using macros of substantially identical design.

The present invention advantageously provides for in-line process control by identifying process-variation induced product-to-scribe line offsets and providing a method to account for these when centering a process for optimum yield to product screen limits. More specifically, according to aspects of the present invention, in-line measurements taken during the manufacturing process can be correlated with measurements of a final product. The correlation between the in-line measurements and the final product measurements can be used to identify process-induced offsets between the same and to established empirical scribe line specification limits. As a result, the present invention can be used to advantageously adjust the manufacturing process to optimize yield to product screen limits.

Moreover, according to aspects of the present invention, analysis can be conducted to proactively predict yield loss and prevent unnecessary consumption of resources. As a result, the present invention can prevent unexpected yield loss. Furthermore, in aspects of the present invention, the test macros in the product and the scribe line can be used to diagnose yield, performance, and functionality.

System Environment

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM),an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wire line, optical fiber cable, radio frequency (RF), etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

FIG. 1 shows an illustrative environment 10 for managing the processes in accordance with the invention. To this extent, the environment 10 includes a server or other computing system 12 that can perform the processes described herein. In particular, the server 12 includes a computing device 14. The computing device 14 can be resident on a network infrastructure or computing device of a third party service provider (any of which is generally represented in FIG. 1).

The computing device 14 also includes a processor 20, memory 22A, an input/output (I/O) interface 24, and a bus 26. The memory 22A can include local memory employed during actual execution of program code, bulk storage, and cache memories which provide temporary storage of at least some program code in order to reduce the number of times code must be retrieved from bulk storage during execution.

In addition, the computing device includes random access memory (RAM), a read-only memory (ROM), and an operating system (O/S).

The computing device 14 is in communication with an external I/O device/resource 28 and a storage system 22B. For example, the I/O device 28 can comprise any device that enables an individual to interact with the computing device 14 (e.g., user interface) or any device that enables the computing device 14 to communicate with one or more other computing devices using any type of communications link. The external I/O device/resource 28 may be for example, a handheld device, personal digital assistant (PDA), handset, keyboard, etc.

In general, the processor 20 executes computer program code (e.g., program control 44), which can be stored in the memory 22A and/or storage system 22B. Moreover, in accordance with aspects of the invention, the program control 44 controls a correlation manager 50 that is configured to perform the processes described herein. For example, the correlation manager 50 can correlate measurements taking during a manufacturing process with final product measurements. In embodiments, substantially identical test macros can be used for in-line manufacturing tests and final product tests, and the correlation manager 50 can be used to correlate measurements taken during these tests. More specifically, the correlation manager 50 can be used to generate an estimation correlation, e.g., a regression line, which indicates the correlation between the in-line manufacturing measurements and the final product measurements. In embodiments, the measurements can include circuit delays and currents, device currents and threshold voltages, as well as line and plate capacitance, line and plate resistance, film thickness, critical dimensions, etc.

Accordingly, the present invention can be used to identify process-induced offsets between product screen macros and inline control macros. Furthermore, aspects of the present invention can be used to identify regional proximity effects across a chip design. In this way, the correlation manager 50 can be used to adjust the manufacturing process or product design. For example, in embodiments, adjustments can include inserting or removing shapes on one or more mask levels in order to alleviate regional proximity effects, changing the scribe line target for device critical dimensions such as gate or diffusion line width, adjusting the conditions of certain thermal anneals, and/or modifying a tool at a particular processing step.

Furthermore, using the correlation manager 50, the present invention can be used to predict a yield loss of a wafer, e.g., 10% or 50% of the products will be defective. In this way, the present invention can be used to proactively predict yield loss for product already processed past the process points that can be readjusted thus preventing unnecessary consumption of resources. More specifically, by predicting the yield loss, the process can be adjusted (for device threshold voltage, gate length, device dielectric thickness, etc.) for product not yet past the process points that can be readjusted.

The correlation manager 50 can be implemented as one or more program codes in the program control 44 stored in memory 22A as separate or combined modules. Additionally, the correlation manager 50 may be implemented as separate dedicated processors or a single or several processors to provide the function described herein. While executing the computer program code, the processor 20 can read and/or write data to/from memory 22A, storage system 22B, and/or I/O interface 24. The program code executes the processes of the invention. The bus 26 provides a communications link between each of the components in the computing device 14.

The computing device 14 can comprise any general purpose computing article of manufacture capable of executing computer program code installed thereon (e.g., a personal computer, server, etc.). However, it is understood that the computing device 14 is only representative of various possible equivalent-computing devices that may perform the processes described herein. To this extent, in embodiments, the functionality provided by the computing device 14 can be implemented by a computing article of manufacture that includes any combination of general and/or specific purpose hardware and/or computer program code. In each embodiment, the program code and hardware can be created using standard programming and engineering techniques, respectively.

Similarly, the computing infrastructure 12 is only illustrative of various types of computer infrastructures for implementing the invention. For example, in embodiments, the server 12 comprises two or more computing devices (e.g., a server cluster) that communicate over any type of communications link, such as a network, a shared memory, or the like, to perform the process described herein. Further, while performing the processes described herein, one or more computing devices on the server 12 can communicate with one or more other computing devices external to the server 12 using any type of communications link. The communications link can comprise any combination of wired and/or wireless links; any combination of one or more types of networks (e.g., the Internet, a wide area network, a local area network, a virtual private network, etc.); and/or utilize any combination of transmission techniques and protocols.

Figure 2:
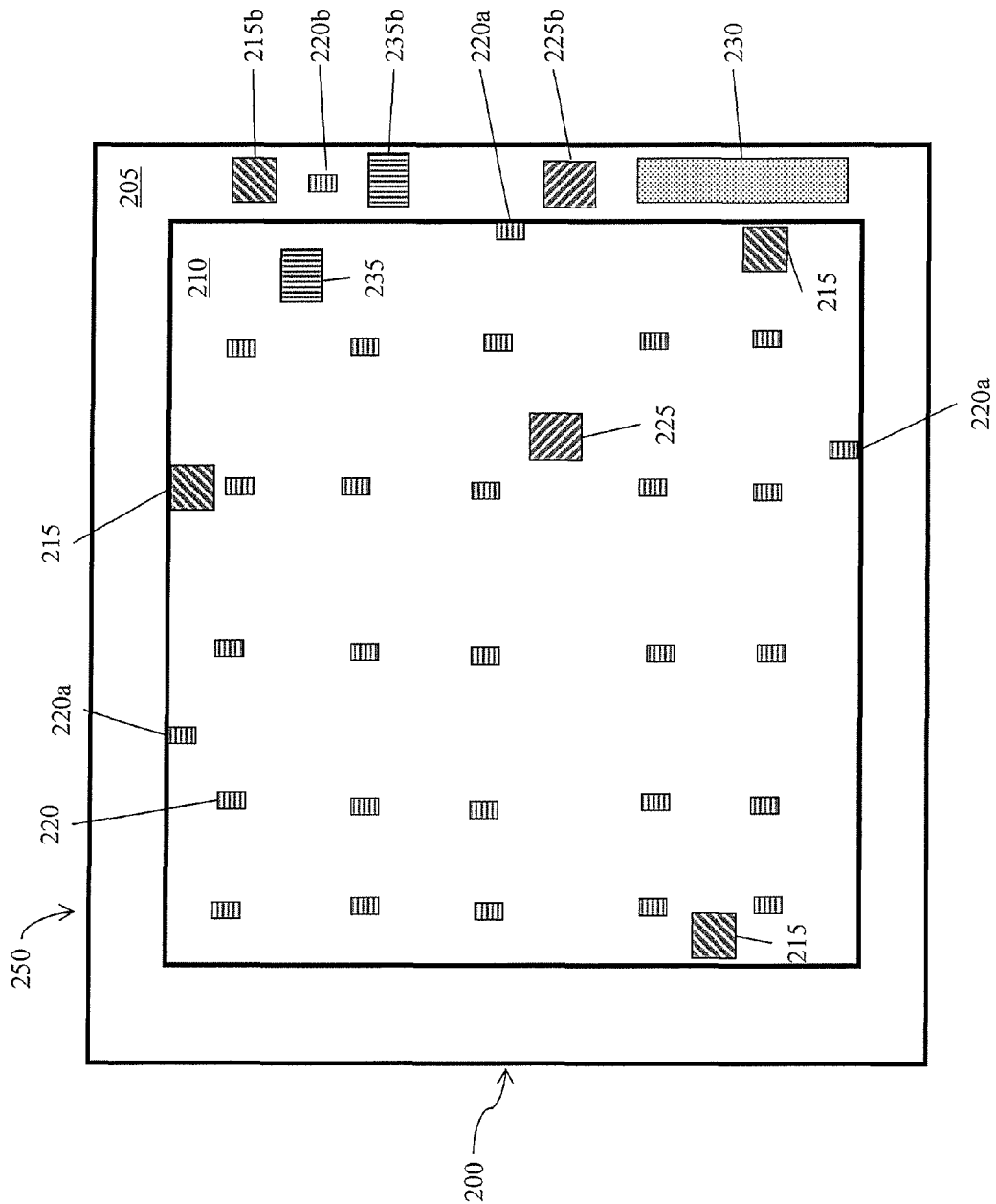
FIG. 2 shows a design layout for monitoring a product in accordance with aspects of the present invention.

FIG. 2 shows a design layout 250 for monitoring a product in accordance with aspects of the present invention. FIG. 2 presents an illustration of an exemplary layout of test macros. However, this may not be the optimum layout for a given technology or product design and alternate layouts are contemplated by the present invention.

More specifically, FIG. 2 shows a wafer 200 that includes a chip 210 surrounded by a scribe line 205 (also referred to as a kerf). The layout 250 includes a plurality of parametric test macros (215, 220, 225, 235). According to aspects of the invention, one or more instances of the parametric test macro designs 215*b*, 220*b*, 225*b*, 235*b* are placed within the scribe line 205. The design and placement of parametric test macros within the chip 210 and scribe line 205 is an aspect of the present invention that may be optimized for the likely sources of variation in a given technology or product design and the cost in design resources, chip and scribe line area, and test and characterization time and capacity.

In embodiments, the layout 250 includes a plurality of performance screen ring oscillators (PSRO) 215 placed on the chip 210. A PSRO acts as a free-running ring of latching stages passing a pulse. The periodicity of the PSRO output provides a relative indication of the speed of the circuit stage, i.e., a short period means a faster circuit speed. The delay of one or more PSRO circuits is commonly used to gauge the circuit performance of the product chip as a whole and to screen out parts that lie outside an acceptable range of values.

More specifically, as shown in FIG. 2, an exemplary design layout 250 includes three edge PSROs 215 placed on the chip 210. In embodiments, the edge PSROs can include multiple circuit topologies built from devices of multiple target threshold voltages and design widths, as would be understood by those of ordinary skill in the art. Although FIG. 2 shows the design layout 250 having three edge PSROs 215, it should be understood that the number of edge PSROs 215 is used for exemplary purposes and that more or less edge PSROs 215 are contemplated by the present invention.

The exemplary design layout 250 further includes a plurality of distributed PSROs 220. For example, as shown in FIG. 2, the design layout 250 includes 25 distributed PSROs 220. In embodiments, the design layout 250 can include a predetermined number (e.g., 25) of the distributed PSROs 220 built across the chip 210 in different configurations. For example, the distributed PSROs 220 may be placed across the chip 210 in substantially a grid type format (e.g., with a predetermined periodicity). More specifically, in embodiments, 25 distributed PSROs 220 are provided on the chip 210 in a 5×5 grid. Additionally, in embodiments, the layout 250 may also include outlying distributed PSROs 220a near the scribe line 205 of the chip 210 depending on the placement of active regions of the chip 210. More specifically, three distributed PSROs 220a can be provided within a designated distance from the edge of the chip 210. In addition, a substantially identical distributed PSRO 220b is provided in the scribe line 205. Although FIG. 2 shows the design layout 250 having 25 distributed PSROs 220 formed in a 5×5 grid and three distributed PSROs 220a and one distributed PSRO 220b in the scribe line, it should be understood that the number of distributed PSROs is used for exemplary purposes and that more or less distributed PSROs are contemplated by the present invention.

In embodiments, a range of values for the measurements of the distributed PSROs (220, 220a), e.g., a minimum value and a maximum value, can be established and/or an average value can be determined. In this way, the correlation can be made between any measurement point in the manufacturing line in the scribe line 205 and the range and/or the average value. That is, according to aspects of the present invention, the range of values and/or the average values of the distributed PSROs (220, 220a) on the chip 210 can be compared to the measurements taken at the distributed PSRO 220b in the scribe line 205.

In implementation, a manufacturer may monitor the measurements of the PSROs (220, 220a, 220b) on the chip 210 and in the scribe line 205, and such measurements can be compared to known test data to optimize wafer yields based on, for example, the chip-mean circuit delay. That is, measurements can be taken in the scribe line 205 after one or more wiring levels are formed and on the chip 210 at the final wafer test. A manufacturer can then compare in-line measurements taken from the distributed PSROs 220b in the scribe line 205 with the measurements, e.g., the range and/or average values, of the distributed PSROs (220, 220a) on the chip 210. Using this comparison, a manufacturer can determine that collections of chips, wafers, or manufacturing lots meet the specification limits and as necessary, adjust the manufacturing process to optimize the yield of parts to those specification limits.

In embodiments, as shown in FIG. 2, the design layout 250 includes statistical process monitors (SPM) 225. These SPMs 225 can be a collection of test macros that measure electrical properties (e.g., device threshold voltage and drive current) for individual N-type and P-type devices. The design of these devices (SPMs 225) may vary by target threshold voltage, gate length, diffusion width, etc. When embedded within a product design, the output of an SPM can be wired out to a reserved output pin. More specifically, in embodiments, an SPM 225 is provided in the scribe line 205 and on the chip 210. In embodiments, the SPMs 225 can be used to establish process-induced offsets in the electrical characteristics of individual devices between the scribe line 205 and the chip 210.

Furthermore, in embodiments, the design layout 250 includes manufacturing kerf structures 230. In embodiments, the manufacturing kerf structures 230 can be used to measure one or more process characteristics (e.g., circuit delays and currents, device currents and threshold voltages, line and plate capacitances, line and plate resistances, film thickness, and critical dimensions). These measurements can be compared to established specification limits and used to adjust the manufacturing process to optimize yields to inline scribe line limits. In addition, the measurements taken on the final product, e.g., chip 210, can be compared with measurements taken from the manufacturing kerf test macros 230. In this way, a correlation can be made between product structures and the manufacturing kerf test macros 230. In this way, the manufacturing process can be further refined, as described herein.

In further embodiments, the design layout 250 can include a set of metal resistance and capacitance measurement macros 235. More specifically, as illustrated in FIG. 2, the metal resistance and capacitance measurement macros can be placed in the chip 210 and the scribe line 205. In embodiments, the metal resistance and capacitance measurement macros 235 can be used to determine that the final product meets predetermined qualification criteria. In this way, the final product can be approved and provided to customers.

Figure 3:
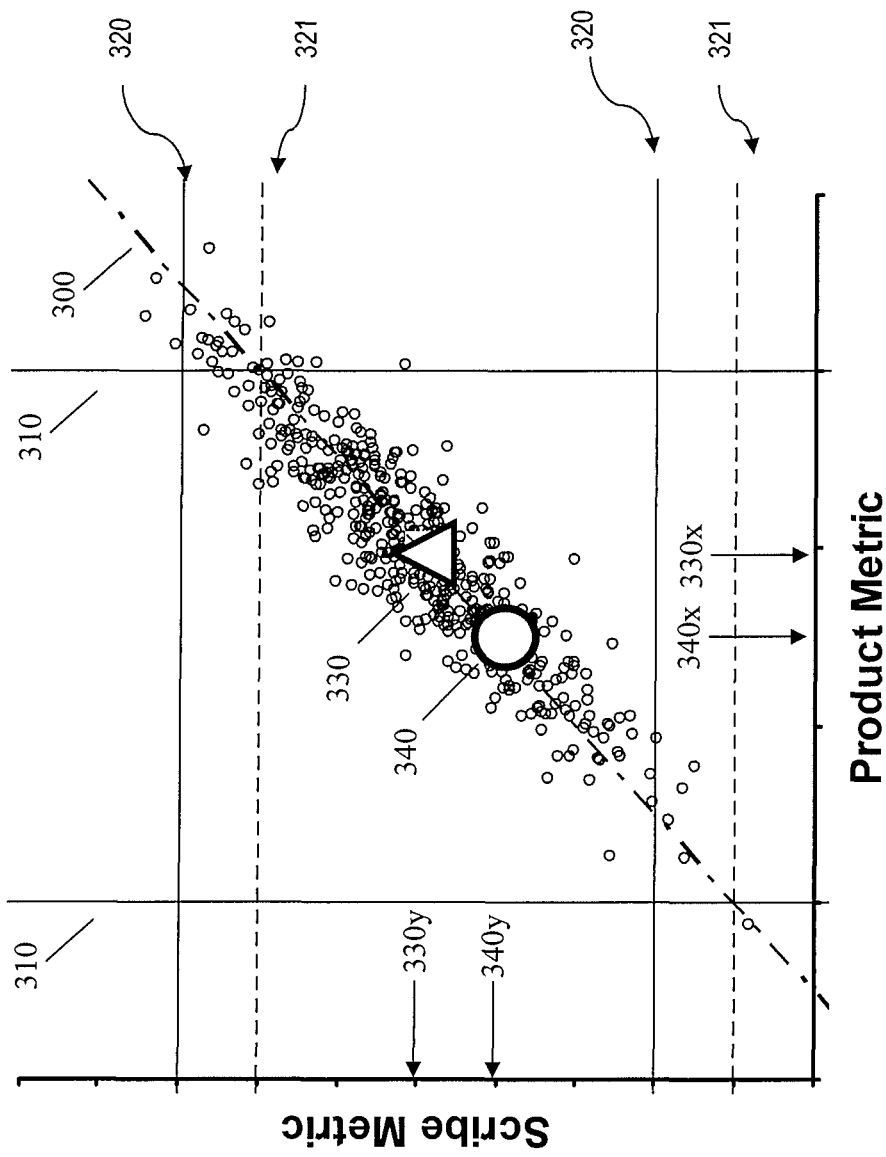
FIG. 3 shows a correlation plot of product and scribe line measurements with certain limits overlaid in accordance with aspects of the present invention.

FIG. 3 shows a correlation plot between scribe line measurements and product measurements in accordance with aspects of the present invention. The distribution of data points has a central (or average) value 330. Overlaid on the data points are initial scribe line specification limits 320. As could be readily determined by someone of ordinary skill in the art, the line center is optimal for yield to the initial scribe line limits 320. In particular, the scribe line data follow a normal distribution and the central scribe line value 330y is located midway between the initial scribe line limits 320.

Also overlaid on the plot in FIG. 3 are product screen limits 310. As could be determined by someone of ordinary skill in the art, the line center is not optimal for the product screen limits. In particular, the product data follow a normal distribution and the central product value 330x is substantially offset from the point 340x, located midway between the product screen limits 310.

In accordance with aspects of the present invention, an estimate correlation line 300 is overlaid on the plot. More specifically, FIG. 3 shows a regression line analysis, i.e., the estimate correlation line 300, between the scribe line measurements and the product measurements. FIG. 3 also illustrates a pair of empirical scribe line specification limits 321, each of which simultaneously intersect one of the intersection points between the correlation line 300 and the product screen limits 310.

In FIG. 3, point 340 has a scribe line measurement 340y located midway between the empirical scribe line limits 321 and also having a product measurement 340x located midway between the product screen limits 310. In accordance with aspects of the present invention, the point 340 is a line center that is optimum for yield to both empirical scribe line limits 321 and product screen limits 310. This is the line center target established through methods of the present invention.

Flow Diagrams

Figure 4:
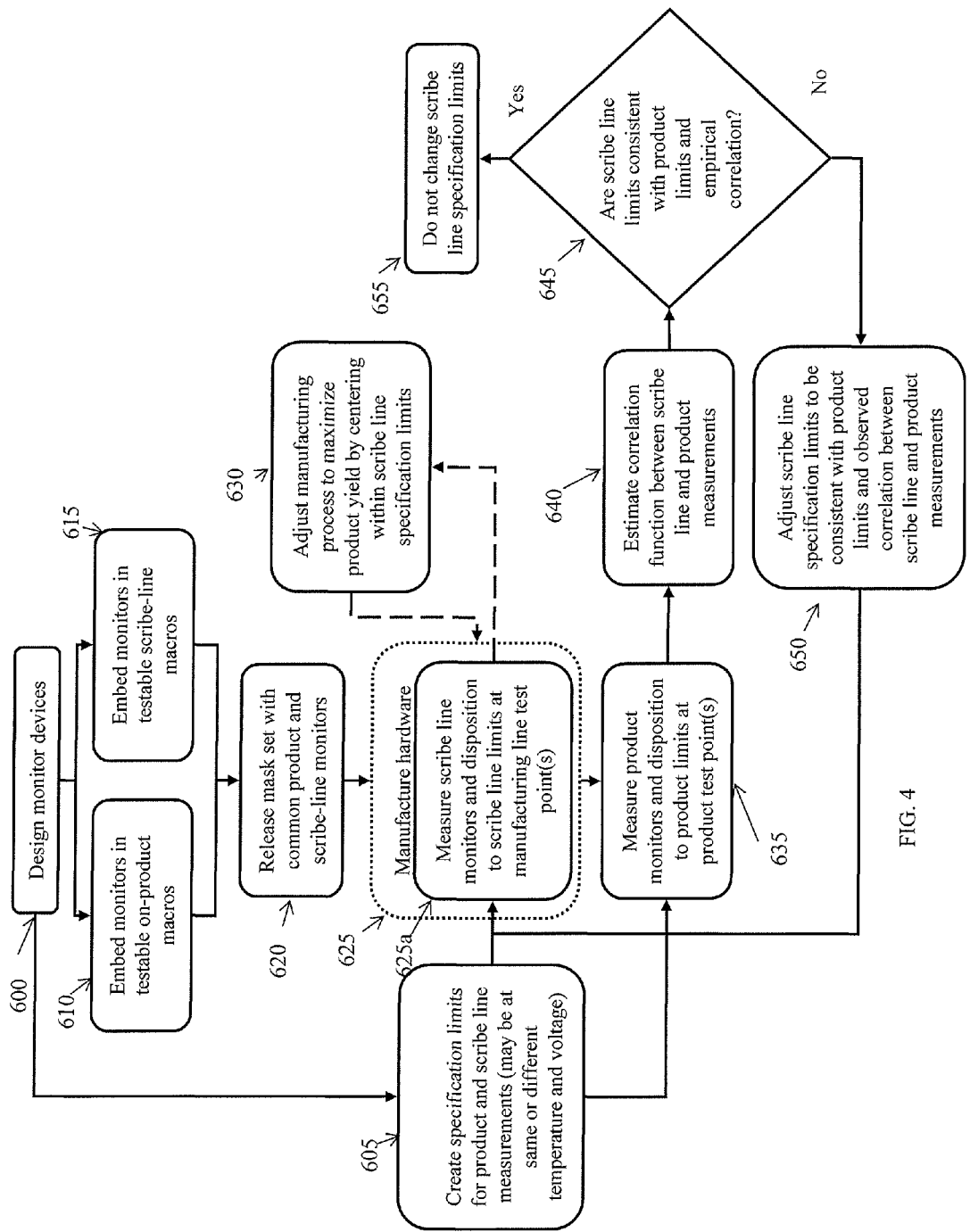
FIG. 4 shows an exemplary flow for performing aspects of the present invention.

FIG. 4 shows exemplary flows for performing aspects of the present invention. The steps of FIG. 4 may be implemented in the environment of FIG. 1, for example. The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Furthermore, the invention can take the form of a computer program product accessible from a computer-usable or computer-readable medium providing program code for use by or in connection with a computer or any instruction execution system. The software and/or computer program product can be implemented in the environment of FIG. 1. For the purposes of this description, a computer-usable or computer readable medium can be any apparatus that can contain, store, or communicate the program for use by or in connection with the instruction execution system, apparatus, or device. The medium can be an electronic, magnetic, optical, electromagnetic, infrared, or semiconductor system (or apparatus or device). Examples of a computer-readable storage medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disc-read/write (CD-R/W) and digital versatile disc (DVD).

FIG. 4 depicts an exemplary flow for a process in accordance with aspects of the present invention. As shown in FIG. 4, at step 600, the process includes designing monitor devices. In embodiments, the monitor devices can be macros of products manufactured on a chip, as described herein. At step 605, specification limits for the product and scribe line measurements can be created. These specification limits can be at a same or different temperature and voltage as should be understood by those of ordinary skill in the art. The process further includes embedding the monitor devices in testable on-product structures and testable scribe-line structures, at steps 610 and 615, respectively.

At step 620, the process can also include releasing a mask set with common product and scribe-line monitors. In this way, a product with the test structures described herein can be manufactured and used to re-center the manufacturing process. The process can include manufacturing hardware, e.g., a semiconductor wafer, at step 625, and measuring scribe-line monitors and dispositions to scribe-line limits at manufacturing line test point(s), as described herein, at step 625a. In embodiments, at step 630, the process can include adjusting a manufacturing process to maximize product yield by centering the manufacturing process within scribe line specification limits, and then reverting to step 625.

At step 635, the process can further include measuring product monitors and dispositions to determine product limits at product test point(s). The process can also include plotting scribe-line versus product measurements and determining an estimate correlation function, at step 640. At step 645, the process includes determining whether the scribe line specification limits are consistent with the product limits and the empirical correlation between scribe line measurements and product measurements, as described herein. When the scribe line specification limits are deemed inconsistent with the product limits and empirical data, the process includes adjusting the scribe line specification limits to be consistent with same at step 650. This may lead to further adjustment of the manufacturing process at step 630. When the scribe line specification limits are deemed consistent with the product limits and empirical data, the scribe line specification limits are not adjusted at step 655.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:
1. A method, comprising:
placing and measuring substantially identical test macros within a chip and in a scribe line;
establishing an estimate correlation between scribe line measurements taken during a manufacturing process and product measurements taken on a final product; and
determining empirical scribe line specification limits consistent with established product screen limits,
wherein the establishing an estimate correlation is a regression line analysis between scribe line measurements and the measurements of the final products, and wherein:
a range enclosed by the scribe line specification limits defines an acceptable scribe line range,
a range enclosed by product specification limits defines an acceptable product range, intersections between the scribe line specification limits and the product specification limits define specification limit corners, and further comprising:
adjusting the empirical scribe line specification limits when the estimate correlation does not intersect the specification limit corners, and
adjusting the manufacturing process to optimize performance to the empirical scribe line specification limits.

2. The method of claim 1, wherein the estimate correlation is an overlay of identification specification limits for the scribe line measurements and final product measurements.

3. The method of claim 1, wherein the test macros placed on the chip and in the scribe line comprise:
one or more edge performance screen ring oscillators (PSROs) placed on an edge of the chip and a PSRO placed in the scribe line;
a plurality of distributed PSROs placed on the chip which comprise a plurality of outlying distributed PSROs near the scribe line and on the chip and a distributed PSRO placed in the scribe line;
a statistical process monitor (SPM) placed on the chip and a SPM placed in the scribe line for measuring electrical properties of N-type and P-type devices; and
manufacturing structures placed in the scribe line.

4. The method of claim 3, wherein the plurality of distributed PSROs on the chip and the distributed PSRO in the scribe line are used to take measurements during the manufacturing process and on the final product.

5. The method of claim 4, wherein:
at least one of a range of values for the measurements of the plurality of distributed PSROs is established and an average value for the measurements of the plurality of distributed PSROs is determined; and
a correlation is made between measurement points in the manufacturing line and at least one of the range and the average value.

6. The method of claim 4, wherein the plurality of distributed PSROs are placed on the chip in a grid format.

7. The method of claim 1, further comprising:
establishing scribe line limit to product limit criteria;
determining that the product satisfies the criteria; and
adjusting the manufacturing process when the criteria are unsatisfied.

8. A method, comprising:
creating specification limits for a product and scribe line measurements;
embedding monitor devices in testable on-product structures and testable scribe-line structures;
measuring scribe line monitors and dispositions to scribe line control limits at manufacturing line test point(s);
measuring product monitors and dispositions to determine product limits at product test point(s); and
determining that an estimate correlation line intersects opposing specification limit corners, wherein:
a range enclosed by scribe line specification limits defines an acceptable scribe line range,
a range enclosed by product specification limits defines an acceptable product range,
intersections between the scribe line specification limits and the product specification limits define the opposing specification limit corners,
adjusting a manufacturing process to maximize product yield by centering the manufacturing process within the scribe line specification limits,
when the estimate correlation line does not intersect the opposing specification limit corners, adjusting the scribe line control limits, such that the estimate correlation line is centered between the opposing specification limit corners; and
when the estimate correlation line intersects the opposing specification limit corners, the scribe line measurement limits are deemed accurate.

9. The method of claim 8, wherein the monitor devices are substantially identical test macros manufactured on a product chip and on a scribe line.

10. The method of claim 8, wherein the specification limits are at a same or different temperature and voltage.

11. The method of claim 8, further comprising releasing a mask set with common product and scribe-line monitors such that a product with the test structures can be manufactured and used to adjust the manufacturing process.

12. The method of claim 8, wherein the measuring scribe line monitors and dispositions to determine scribe line limits at inline test point(s) comprising plotting scribe-line versus product measurements and determining the estimate correlation line.

13. The method of claim 8, wherein when the estimate correlation line does not intersect the opposing specification limit corners, repeating the adjusting the scribe line control limits until the correlation line intersects the opposing specification limit corners.

14. A computer system for process control in a semiconductor manufacturing line, the system comprising:
a CPU, a computer readable memory and a computer readable storage media;
first program instructions to measure test macros placed within a chip and in a scribe line;
second program instructions to determine an estimate correlation function between measurements taken in the scribe line and measurements taken in a final product;
third program instructions to compute empirical scribe line specification limits consistent with input product screen limits; and
fourth program to adjust a manufacturing process in order to optimize performance to the empirical scribe line specification limits,
wherein the first, second, third and fourth program instructions are stored on the computer readable storage media for execution by the CPU via the computer readable memory,
wherein the computing empirical scribe line specification limits comprises performing a regression line analysis between scribe line measurements and final product measurements:
wherein:
a range enclosed by scribe line specification limits defines an acceptable scribe line range,
a range enclosed by product specification limits defines an acceptable product range,
intersections between the scribe line specification limits and the product specification limits define specification limit corners, and
the empirical scribe line specification limits are adjusted when the estimate correlation function does not intersect the specification limit corners.

15. The system of claim 14, further comprising placing product macros on the chip and in the scribe line which comprises:
placing one or more edge performance screen ring oscillators (PSROs) on the chip and a PSRO placed in the scribe line;

placing a plurality of distributed PSROs on the chip and a distributed PSRO in the scribe line;

placing a statistical process monitor (SPM) on the chip and a SPM in the scribe line; and placing manufacturing structures placed in the scribe line, wherein the plurality of distributed PSROs on the chip and the distributed PSRO in the scribe line are used to take measurements during the manufacturing process and on a final product.

16. The system of claim 15, wherein:

at least one of a range of values for the measurements of the plurality of distributed PSROs is established and an average value for the measurements of the plurality of distributed PSROs is determined; and a correlation is made between measurement points in a manufacturing line and at least one of the range and the average value used to adjust manufacturing processes.

17. The method of claim 1, wherein the scribe line measurements and the product measurements comprise circuit delays and currents, device currents and threshold voltages, line and plate capacitance, line and plate resistance, film thickness, and critical dimensions.

18. The method of claim 1, wherein the test macros placed on the chip and in the scribe line comprise a set of metal resistance and capacitance measurement macros placed on the chip and in the scribe line for determining that the final product meets qualification criteria.

19. The method of claim 1, wherein the manufacturing process being adjusted comprises inserting or removing shapes on one or more mask levels in order to alleviate regional proximity effects across a chip design, changing a scribe line target for device critical dimensions including gate or diffusion line width, and adjusting conditions of thermal anneals.

20. The method of claim 3, wherein the PSROs are a free-running ring of latching stages which pass a pulse to provide an indication of a speed of a circuit stage in the chip such that a shorter period indicates a faster circuit speed, the edge PSROs include multiple circuit topologies from devices of multiple target threshold voltages and design widths, and the plurality of distributed PSROs are placed on the chip in a grid format.

* * * * *